(12) United States Patent
Cho et al.

(10) Patent No.: US 9,496,449 B2
(45) Date of Patent: Nov. 15, 2016

(54) METHOD FOR MANUFACTURING CI(G)S-BASED THIN FILM COMPRISING CU-SE THIN FILM USING CU-SE TWO-COMPONENT NANOPARTICLE FLUX, AND CI(G)S-BASED THIN FILM MANUFACTURED BY THE METHOD

(75) Inventors: Ara Cho, Seoul (KR); SeJin Ahn, Daejeon (KR);
(Continued)

(73) Assignee: Korea Institute of Energy Research, Daejeon (KR)

( * ) Notice: Subject to any disclaimer, the term of this patent is extended or adjusted under 35 U.S.C. 154(b) by 325 days.

(21) Appl. No.: 14/232,829

(22) PCT Filed: Jul. 17, 2012

(86) PCT No.: PCT/KR2012/005695
§ 371 (c)(1),
(2), (4) Date: Apr. 4, 2014

(87) PCT Pub. No.: WO2013/012240
PCT Pub. Date: Jan. 24, 2013

(65) Prior Publication Data
US 2014/0216552 A1 Aug. 7, 2014

(51) Int. Cl.
*H01L 31/18* (2006.01)
*H01L 31/0749* (2012.01)
(Continued)

(52) U.S. Cl.
CPC .......... *H01L 31/18* (2013.01); *H01L 21/02422* (2013.01); *H01L 21/02491* (2013.01);
(Continued)

(58) Field of Classification Search
CPC .............. H01L 31/0749; H01L 31/18; H01L 31/0322; H01L 31/035218; H01L
(Continued)

(56) References Cited

U.S. PATENT DOCUMENTS

2006/0207644 A1* 9/2006 Robinson .............. C23C 18/02
136/243
2007/0289624 A1 12/2007 Kuriyagawa et al.
(Continued)

FOREIGN PATENT DOCUMENTS

JP 2011-016707 A 1/2011
KR 10-2007-0055497 A 5/2007
(Continued)

OTHER PUBLICATIONS

English Translation of the International Search Report dated Jan. 14, 2013 for corresponding International Patent Application No. PCT/KR2012/005695, filed Jul. 17, 2012.
(Continued)

*Primary Examiner* — Matthew Martin
(74) *Attorney, Agent, or Firm* — Amanda M. Prose; Westman, Champlin & Koehler, P.A.

(57) ABSTRACT

A method for manufacturing a CI(G)S-based thin film using a Cu—Se two-component nanoparticle flux, and a CI(G)S-based thin film manufactured by the method are provided. The method for manufacturing the CI(G)S-based thin film, according to the present invention, comprises the steps of: manufacturing Cu—Se two-component nanoparticles and In nanoparticles; manufacturing a slurry comprising the Cu—Se two-component nanoparticles by mixing the Cu—Se two-component nanoparticles, a solvent, and a binder, and manufacturing a slurry comprising the In nanoparticles by mixing the In nanoparticles, a solvent, and a binder; forming a thin film in which a plurality of layers are laminated by alternately coating the slurry comprising the Cu—Se two-component nanoparticles and the slurry comprising the In nanoparticles on a substrate, regardless of order; and heat-processing the thin film which is formed.

11 Claims, 8 Drawing Sheets

(75) Inventors: Kyung-Hoon Yoon, Daejeon (KR);
Jae-Ho Yun, Daejeon (KR); Jihye Gwak, Daejeon (KR); Kee-Shik Shin, Daejeon (KR); SeoungKyu Ahn, Daejeon (KR)

(51) Int. Cl.
*H01L 21/02* (2006.01)
*H01L 31/032* (2006.01)
*H01L 31/0352* (2006.01)

(52) U.S. Cl.
CPC ... *H01L 21/02568* (2013.01); *H01L 21/02601* (2013.01); *H01L 21/02614* (2013.01); *H01L 21/02628* (2013.01); *H01L 31/0322* (2013.01); *H01L 31/035218* (2013.01); *H01L 31/0749* (2013.01); *Y02E 10/541* (2013.01)

(58) Field of Classification Search
CPC ............. 21/02568;H01L 21/02601; H01L 21/02614; H01L 21/02422; H01L 21/02491; H01L 21/02628; Y02E 10/541
See application file for complete search history.

(56) References Cited

U.S. PATENT DOCUMENTS

| 2008/0142084 | A1 | 6/2008 | Yu et al. |
| 2009/0242033 | A1* | 10/2009 | Yoon ............ H01L 31/0322 136/264 |
| 2011/0048524 | A1* | 3/2011 | Nam ............ H01L 31/0322 136/256 |

FOREIGN PATENT DOCUMENTS

| KR | 10-2008-0009345 A | 1/2008 |
| KR | 10-2009-0043245 A | 5/2009 |
| KR | 10-2009-0043265 A | 5/2009 |
| KR | 10-2011-0055138 A | 5/2011 |

OTHER PUBLICATIONS

Written Opinion dated Jan. 14, 2013 for corresponding International Patent Application No. PCT/KR2012/005695, filed Jul. 17, 2012.
International Preliminary Report on Patentability and English Translation of the Written Opinion dated Jan. 21, 2014 for corresponding International Patent Application No. PCT/KR2012/005695, filed Jul. 17, 2012.

* cited by examiner (a)

(b)

(a)

(b)

(a)

(b)

(a)

(b)

METHOD FOR MANUFACTURING CI(G)S-BASED THIN FILM COMPRISING CU-SE THIN FILM USING CU-SE TWO-COMPONENT NANOPARTICLE FLUX, AND CI(G)S-BASED THIN FILM MANUFACTURED BY THE METHOD

TECHNICAL FIELD

The present invention relates to a method for manufacturing a CI(G)S-based thin film for solar cells, and a CI(G)S-based thin film manufactured by the method. More specifically, the present invention relates to a method for manufacturing a CI(G)S-based thin film including a Cu—Se thin film having a dense structure formed by introducing Cu—Se two component nanoparticles to act as a flux for the thin film in manufacture of a CI(G)S-based thin film through a non-vacuum coating process, and a CI(G)S-based thin film manufactured by the method.

BACKGROUND ART

A thin film solar cell may employ a CIS thin film or a CIGS thin film as a photo-absorption layer. The CIS thin film or CIGS thin film is a Group I-III-VI compound semiconductor. Specifically, the CIS or CIGS thin film may be formed to a thickness of 10 micrometers or less and exhibits stable properties in long term use. Thus, the thin film is expected to be used as a low cost and high efficiency solar cell capable of replacing a silicon thin film.

Specifically, the CIS thin film is a direct transition type semiconductor and may be formed into a thin film. Further, the CIS thin film has a band-gap of 1.04 eV, which is suitable for photo conversion, and exhibits the highest coefficient of photo absorption among solar cell materials known in the art. In addition, the CIGS thin film is developed to replace some of indium (In) by gallium (Ga) or to replace sulfur (S) by selenium (Se) to improve low open circuit voltage of the CIS thin film.

A CIGS solar cell is manufactured using a thin film having a thickness of several micrometers by vacuum deposition or non-vacuum coating. Vacuum deposition has an advantage in that it provides a highly efficient absorption layer. However, vacuum deposition provides low uniformity when a large area absorption layer is formed, and requires high manufacturing costs.

Among vacuum deposition processes, a three-step vacuum co-evaporation process widely known in the art will be described hereinafter.

FIG. 8 depicts a thermal history curve in a typical three-step vacuum co-evaporation process. FIG. 9 is a flowchart of the typical three-step vacuum co-evaporation process.

Referring to FIGS. 8 and 9, the typical three-step vacuum co-evaporation process is largely comprised of three steps. Particularly, in Step 1, In, Ga, and Se are co-evaporated on a substrate on which a Mo electrode is formed, thereby forming a thin film on the substrate. In Step 2, Cu and Se are co-evaporated at high temperature. In Step 3, In, Ga, and Se are co-evaporated again to form a CIS-based thin film.

Particularly, in Step 2, due to co-evaporation of Cu and Se, the two component Cu—Se compound acts as a flux at high reaction temperature and fills the grain boundary of previously formed $(In, Ga)_2Se_3$ particles to grow particles, which in turn fill voids to form a CIGS thin film having a dense structure. This is one important feature of vacuum co-evaporation as a vacuum deposition technique.

On the other hand, heat treatment at high temperature after depositing a precursor material may reduce manufacturing costs and is capable of preparing a large scale layer uniformly. However, heat treatment has a drawback in that it provides low efficiency of an absorption layer.

Since the CIGS thin film formed by depositing a precursor material in a non-vacuum state has lots of pores and exhibits non-dense characteristics, selenization heat treatment is performed. Since typical selenization heat treatment is performed using toxic hydrogen selenide ($H_2Se$) gas, high installation costs are required to provide a safety system to guarantee safety. Further, since heat treatment is performed for a long period of time, there is a drawback that manufacturing costs for the CIGS thin film increase.

In addition, since the CIGS thin film has very high melting point of 1000° C. or more, it is difficult even for CIGS particles having a size of dozens of nanometers to allow particle growth and densification through post-heat treatment.

As the related art, there are Korean Patent Publication No. 10-2009-0043265A, Korean Patent Publication No. 10-2007-0055497A, and the like.

DISCLOSURE

Technical Problem

It is an object of the present invention to provide a method for manufacturing a CI(G)S-based thin film, which exhibits excellent particle growth and has a dense structure in which voids are minimized, using Cu—Se two component nanoparticles to act as a flux as in a vacuum coating process, through a non-vacuum coating process, which is a relatively easy preparing technique.

Technical Solution

In accordance with one aspect of the present invention, a method for manufacturing a CI(G)S-based thin film using a Cu—Se two component nanoparticle flux includes: preparing Cu—Se two-component nanoparticles and In nanoparticles (Step a); preparing a slurry including the Cu—Se two-component nanoparticles by mixing the Cu—Se two-component nanoparticles, a solvent, and a binder, and preparing a slurry including the In nanoparticles by mixing the In nanoparticles, a solvent, and a binder (Step b); forming a thin film comprised of multiple layers stacked one above another by alternately coating the slurry including the Cu—Se two-component nanoparticles and the slurry including the In nanoparticles onto a substrate, in any order (Step c); and heat treating the resulting thin film (Step d).

Step (a) may be performed by any one of a low temperature colloidal process, a solvothermal synthesis process, a microwave process, and an ultrasonic wave synthesis process.

The solvent may be an alcohol-based solvent.

The alcohol-based solvent may include any one selected from the group consisting of ethanol, methanol, pentanol, propanol, and butanol.

The binder may include any one selected from ethylene glycol, propylene glycol, ethylcellulose, polyvinylpyrrolidone, ethylenediamine, monoethanolamine, diethanolamine, and triethanolamine.

Step (b) may further include ultrasonic treatment such that the slurry components are mixed and dispersed.

Step (c) may be performed by a non-vacuum coating process.

The non-vacuum coating process may be any one selected from spraying, ultrasonic spraying, spin coating, doctor blade coating, screen printing, and inkjet printing.

Step (c) may further include drying after each layer is coated upon formation of the thin film comprised of the multiple layers.

The thin film comprised of the multiple layers may be a thin film comprised of two or three layers stacked one above another.

Step (d) may be performed by heat treatment while supplying selenium vapor.

The heat treatment may be performed at a substrate temperature ranging from 520° C. to 550° C. for 60 minutes to 90 minutes.

In order to accomplish the object of the present invention, the CI(G)S-based thin film using a Cu—Se two component nanoparticle flux is comprised of multiple layers stacked one above another by alternately coating a slurry including Cu—Se two-component nanoparticles and a slurry including In nanoparticles onto a substrate, regardless of order.

In order to accomplish the object of the present invention, a solar cell may employ a CI(G)S-based thin film as a photo-absorption layer. The CI(G)S-based thin film is comprised of multiple layers stacked one above another by alternately coating a slurry including Cu—Se two-component nanoparticles and a slurry including In nanoparticles onto a substrate, regardless of order.

Advantageous Effects

The present invention ascertains and employs the role of Cu—Se nanoparticle slurries to improve energy conversion efficiency of a CI(G)S-based thin film solar cell. The present invention is capable of preparing a thin film having a dense structure by introducing Cu—Se two component nanoparticles into a slurry by a non-vacuum coating process, followed by heat treatment to allow the slurry to act as the flux, thereby allowing sufficient particle growth and filling voids between particles.

BEST MODE

Figure 1:
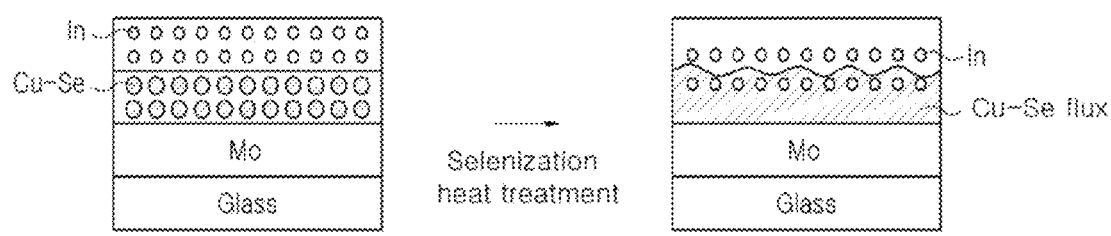
FIG. 1 is a schematic side sectional view of a CI(G)S-based thin film manufactured in Example 1 of the present invention.

Hereinafter, a method for manufacturing a CI(G)S-based thin film according to the present invention will be described in detail.

As used herein, the term "CI(G)S-based thin film" refers to either a CIS-based or CIGS-based thin film.

The method for manufacturing a CI(G)S-based thin film including Cu—Se thin film using a Cu—Se two component nanoparticle flux is capable of manufacturing a dense CI(G) S-based thin film by preparing a slurry including the Cu—Se two-component nanoparticles and a slurry including the In nanoparticles; subjecting the slurries to non-vacuum coating such that the slurries are alternately laminated; and heat treating the resulting thin film such that the Cu—Se two component nanoparticles act as the flux, thereby obtaining a dense CI(G)S-based thin film. The method is described in more detail hereinafter.

First of all, Cu—Se two-component nanoparticles and In nanoparticles are prepared, respectively (Step a).

The Cu—Se two-component nanoparticles and the In nanoparticles may be prepared by a method known in the art, such as a low temperature colloidal process, a solvothermal synthesis process, a microwave process, an ultrasonic wave synthesis process, and the like. The In nanoparticles may be prepared from In—Se two component nanoparticles in the same manner as the Cu—Se two component nanoparticles.

Next, a slurry including the Cu—Se two-component nanoparticles and a slurry including the In nanoparticles are prepared (Step b).

The slurry including the Cu—Se two-component nanoparticles may include the Cu—Se two component nanoparticles, a solvent and a binder.

Further, the slurry including the In nanoparticles may include the In nanoparticles, a solvent, and a binder.

The solvent may be an alcohol-based solvent such as methanol, ethanol, pentanol, propanol, butanol, and the like.

The binder may be ethylene glycol, propylene glycol, ethylcellulose, polyvinylpyrrolidone, ethylenediamine, monoethanolamine, diethanolamine, triethanolamine, and the like.

The ratio of Cu—Se nanoparticles may be adjusted to adjust concentration of the slurries, and the ratio of the binder may be adjusted to adjust viscosity of the slurries.

The slurries may be subjected to ultrasonic treatment to be dispersed and mixed.

Next, the slurry including the Cu—Se two-component nanoparticles and the slurry including the In nanoparticles are alternately coated onto a substrate in any order to form a thin film comprised of multiple layers stacked one above another (Step c).

Specifically, the slurry including the Cu—Se two-component nanoparticles and the slurry including the In nanoparticles are alternately coated onto the substrate, in which the first coating layer on the substrate may be either of the two slurries.

After one coating layer is formed, the layer is dried to remove the solvent and the binder.

Further, the laminated coating layers are comprised of two or more layers. The number of coating layers may be adjusted as needed. Preferably, the laminated coating layers may include two to three layers.

The method for forming the coating layers may employ a non-vacuum coating process.

As the non-vacuum coating process, any non-vacuum coating process well known in the art, such as spraying, ultrasonic spraying, spin coating, doctor blade coating, screen printing, inkjet printing, and the like, may be used. By employing such a non-vacuum coating process, it is possible to reduce manufacturing costs as compared with a typical vacuum evaporation process.

The non-vacuum coating and drying procedures may be performed repeatedly depending upon a desired thickness to form a thin film including multiple layers. Although the number of repeating cycles can differ as needed, the procedures are preferably repeated two or three times.

After that, the thin film formed in Step (c) is subjected to selenization heat treatment using selenium vapor (Step d).

Heat treatment using selenium vapor may be performed by supplying selenium vapor formed by heating and evaporating a selenium solid while warming a substrate on which the thin film has been formed.

The heat treatment may be performed at a substrate temperature ranging from 500° C. to 550° C. for 60 minutes to 90 minutes.

Through the above procedures, selenization is performed on the thin film after Step (c). At the same time, the structure of the thin film is finally densified by the Cu—Se two component nanoparticles acting as the flux, thereby providing a final thin film. Specifically, the Cu—Se nanoparticles sufficiently act as the flux in the thin film and fill the grain boundary of particles of elements, thereby forming a thin film having a dense structure by growing particles and filling voids between the particles.

In the method for manufacturing a CI(G)S-based thin film according to this embodiment, the Cu—Se thin film and the In thin film are alternately coated. However, it should be under stood that the present invention is not limited thereto. In some embodiments, a thin film including both In and Ga may be used instead of the In thin film.

Further, the present invention provides a CI(G)S-based thin film manufactured by the method according to the present invention.

The CI(G)S-based thin film is comprised of multiple layers by alternately stacking the slurry including the Cu—Se two-component nanoparticles and the slurry including the In nanoparticles on a substrate on which a Mo electrode is formed, in any order. Although the number of layers can differ as needed, the thin film preferably includes two or three layers.

Furthermore, the present invention provides a solar cell including the CI(G)S-based thin film as a photo-absorption layer.

MODE FOR INVENTION

Hereinafter, the invention will be described in more detail with reference to some examples.

Example 1

In a glove box, 0.286 g of CuI was mixed with 30 ml of distilled pyridine solvent, followed by mixing with 0.094 g of $Na_2Se$ dissolved in 20 ml of distilled methanol. The atomic ratio of Cu:Se was 2:1. Then, the methanol/pyridine mixture was reacted for 7 minutes while mechanically stirring in an ice bath at 0° C. to synthesize a colloid including Cu—Se two component nanoparticles.

The colloid was centrifuged at 10000 rpm for about 10 minutes, followed by ultrasonication for 1 minute, and then washed with distilled methanol. By repeating the above procedures, pyridine and by-products were completely removed, thereby synthesizing Cu—Se two component nanoparticles having high purity.

Next, the Cu—Se nanoparticles, propylene glycol as a binder, and methanol as a solvent were mixed, followed by ultrasonication for 60 minutes to manufacture a slurry including the Cu—Se two component nanoparticles. The weight ratio of the Cu—Se nanoparticles:methanol:propylene glycol was 3:12:4.

Further, a colloid including In—Se nanoparticles was synthesized by the same method except that $InI_3$ was used instead of CuI and the atomic ratio of In:Se=2:3. A slurry including the In nanoparticles was prepared by the same method for preparation of the slurry including the Cu—Se two component nanoparticles.

Subsequently, the slurry including the Cu—Se two component nanoparticles was coated onto a soda lime glass substrate, on which a Mo electrode was formed, by doctor blade coating. A space between the blade and the glass substrate on which a Mo electrode was formed was set to 50 μm.

After coating, the coating layer was dried on a hot plate in two stages. The first drying stage was performed at 80° C. for 5 minutes and the second drying stage was performed at 200° C. for 5 minutes.

Next, the slurry including the In nanoparticles was coated onto the coating layer, followed by drying. Coating and drying were performed in the same manner as in coating and drying of the slurry including the Cu—Se two component nanoparticles.

Finally, the coating layers were subjected to selenization heat treatment at a substrate temperature of 550° C. for 60 minutes while supplying Se vapor, thereby providing a completed thin film.

FIG. 1 is a schematic side sectional view of a CI(G)S-based thin film manufactured in Example 1. Referring to FIG. 1, it can be seen that the Cu—Se nanoparticles were melted into In nanoparticles, thereby providing a dense structure to the thin film.

Example 2

A thin film was manufactured in the same manner as in Example 1 except that the slurry including In nanoparticles was firstly coated and dried on the soda lime glass substrate, on which a Mo electrode was formed, followed by coating the slurry including Cu—Se nanoparticles and drying. Namely, only the coating order was changed.

Figure 2:
FIG. 2 is a schematic side sectional view of a CI(G)S-based thin film manufactured in Example 2 of the present invention.

FIG. 2 is a schematic side sectional view of a CI(G)S-based thin film manufactured in Example 2. Referring to FIG. 2, it can be seen that the Cu—Se nanoparticles were melted into In nanoparticles, thereby providing a dense structure to the thin film.

Next, in the method for manufacturing CI(G)S-based thin film according to the present invention, in order to identify suitable heat treatment conditions for the Cu—Se two component nanoparticles to act effectively as a flux, the slurries including Cu—Se two component nanoparticles were coated by changing selenization heat treatment conditions to form thin films, and then the structures of the thin films were compared.

Experimental Example

A slurry including Cu—Se two component nanoparticles was prepared under the same conditions as in Example 1. The slurry was coated onto a soda lime glass substrate on which a Mo electrode was formed, and dried.

Such coating and drying were repeated twice to form a thin film having a predetermined thickness.

Subsequently, the thin film was subjected to selenization heat treatment for 60 minutes while supplying Se vapor at a substrate temperature of 550° C.

Figure 3:
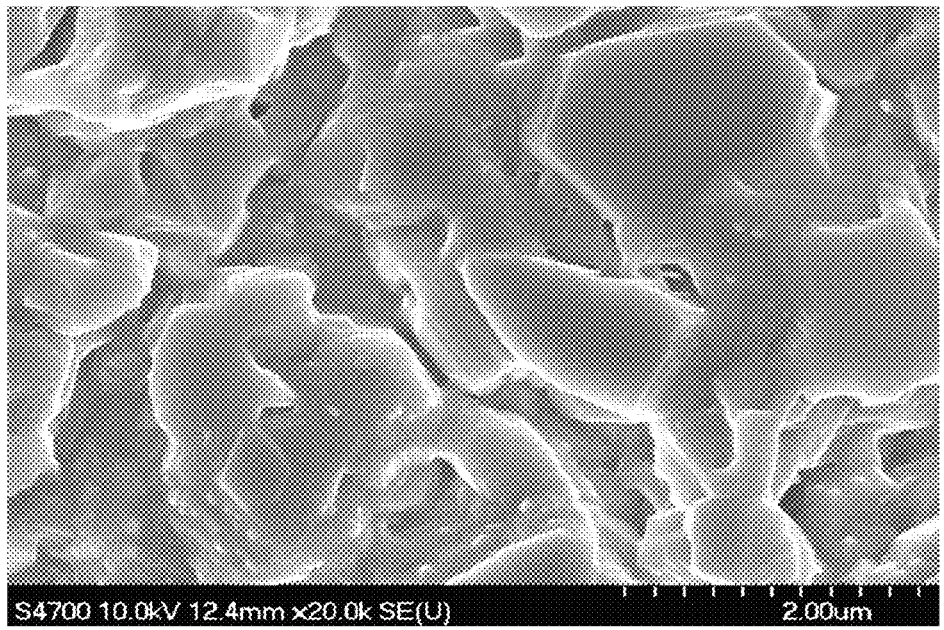
FIG. 3 (a) is a surface scanning electron microscope (SEM) image of a thin film manufactured in Experimental Example of the present invention, and FIG. 3 (b) is an SEM image of a side section of the thin film manufactured in Experimental Example of the present invention.
Figure 3:
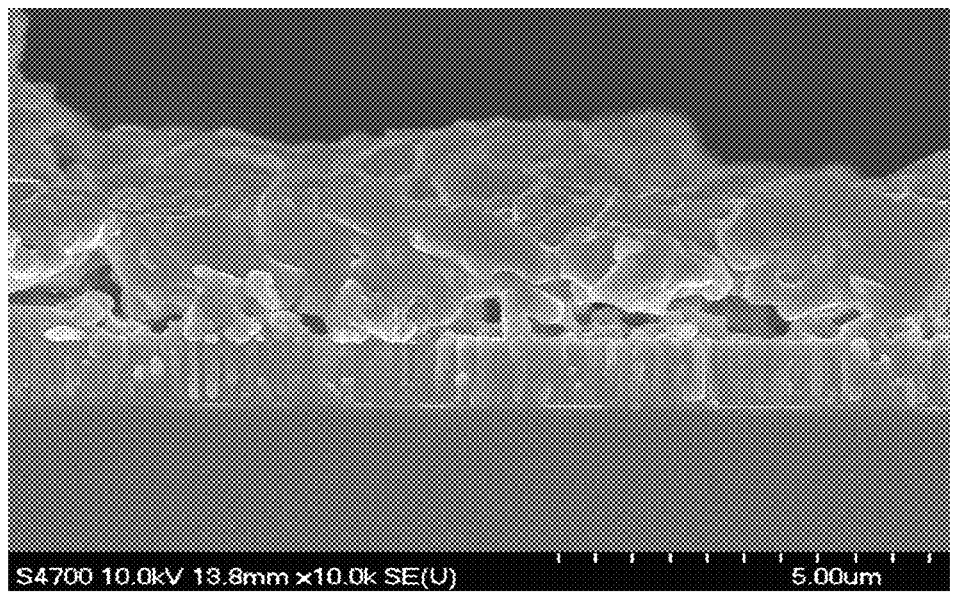

FIG. 3 (a) is a scanning electron microscope (SEM) image of a surface of a thin film manufactured in Experimental Example, and FIG. 3 (b) is an SEM image of a side section of the thin film.

Referring to FIG. 3a and FIG. 3b, it can be seen that the Cu—Se thin film manufactured in Experimental Example showed sufficient particle growth, and had a dense structure in view of small number and size of pores.

Figure 4:
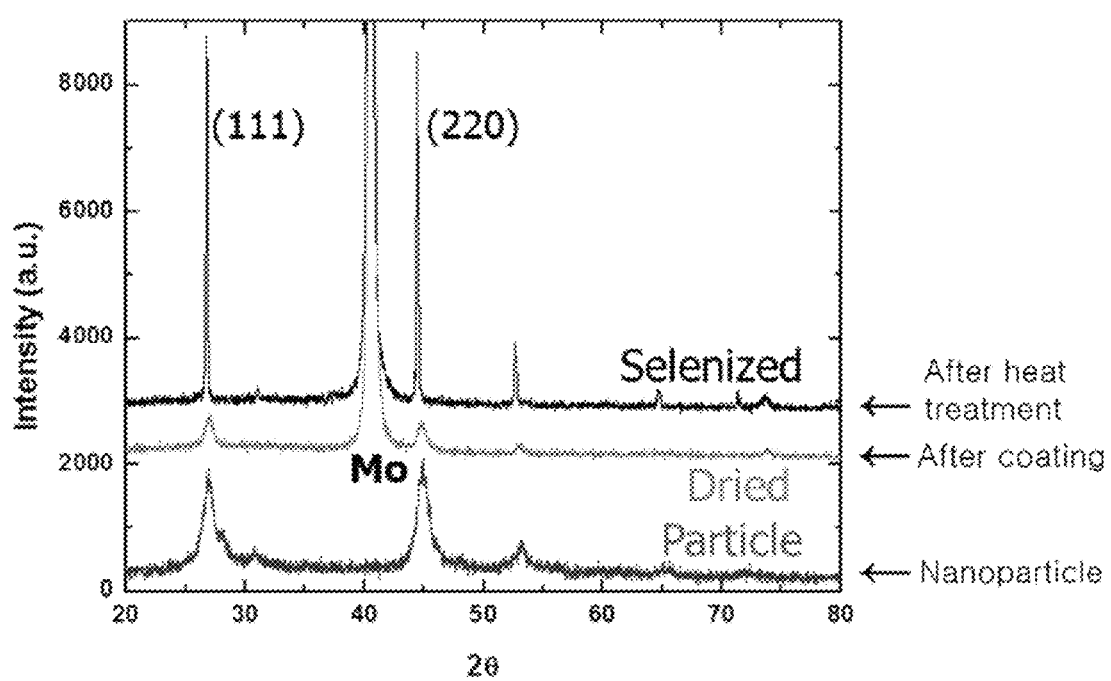
FIG. 4 depicts XRD analysis results of the Cu—Se nanoparticles manufactured in Experimental Example of the present invention and of a thin film after coating and heat treatment, respectively.

FIG. 4 depicts XRD analysis results of the Cu—Se nanoparticles manufactured in Experimental Example of the present invention and of a thin film after coating and heat treatment, respectively.

Referring to FIG. 4, it can be seen from the XRD analysis results that the Cu—Se nanoparticles had a $Cu_{2-x}Se$ phase, and that the nanoparticles, the thin film after coating, and the thin film after heat treatment showed no phase change. From those results, it can be seen that the thin film was comprised of the same material.

Comparative Example 1

A thin film was manufactured in the same manner as in Experimental Example except that selenization heat treatment was not performed.

Figure 5:
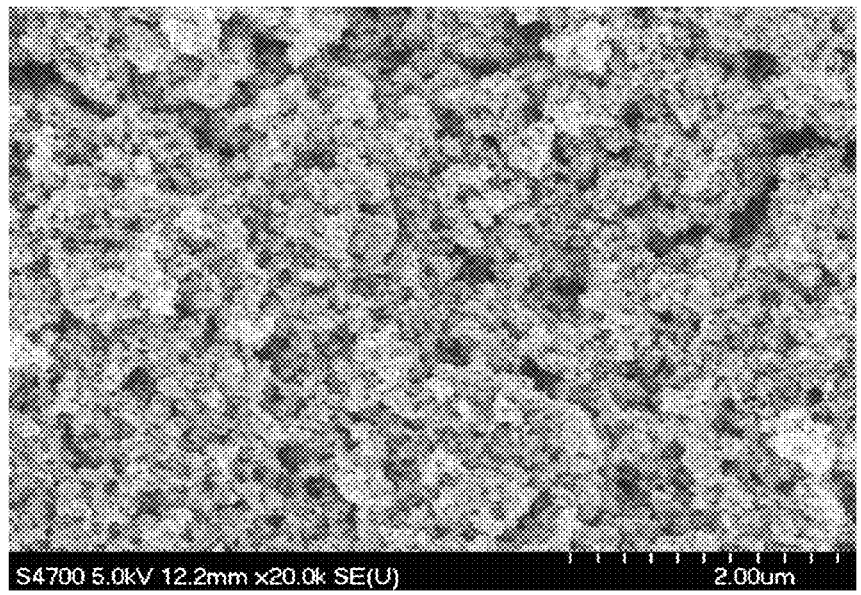
FIG. 5 (a) is an SEM image of a surface of a thin film manufactured in Comparative Example 1, and FIG. 5 (b) is an SEM image of a side section of the thin film manufactured in Comparative Example 1.
Figure 5:
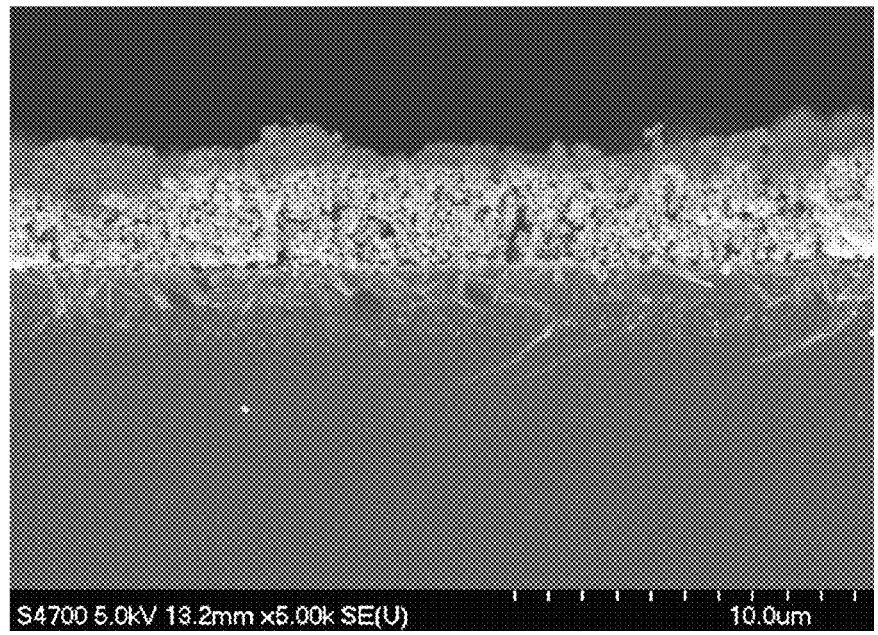

FIG. 5 (a) is an SEM image of a surface of a Cu—Se thin film manufactured in Comparative Example 1, and FIG. 5 (b) is an SEM image of a side section of the Cu—Se thin film manufactured in Comparative Example 1.

Referring to FIG. 5 (a) and FIG. 5 (b), it can be seen that the Cu—Se thin film manufactured in Comparative Example 1, as compared to Experimental Example, showed insufficient particle growth by heat treatment, and thus had a small particle size. As a result, the thin film had a small void size, and exhibited a relatively dense structure.

Comparative Example 2

A thin film was manufactured in the same manner as in Experimental Example except that selenization heat treatment was performed at a substrate temperature of 480° C. for 60 minutes. Namely, as compared to Experimental Example, the time for the selenization heat treatment was the same, but the temperature for selenization heat treatment was relatively lower.

Figure 6:
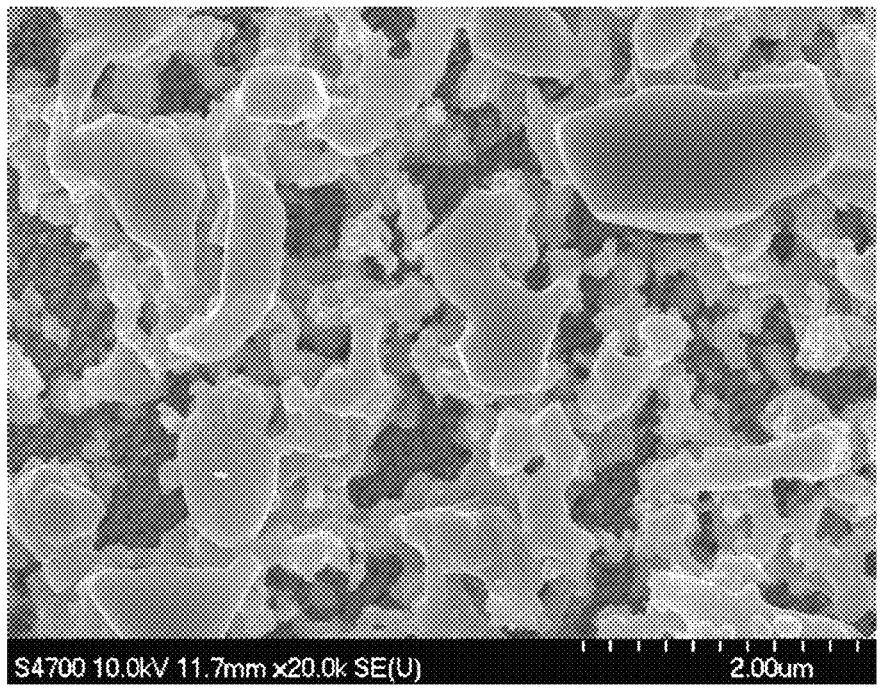
FIG. 6 (a) is an SEM image of a surface of a thin film manufactured in Comparative Example 2, and FIG. 6 (b) is an SEM image of a side section of the thin film manufactured in Comparative Example 2.
Figure 6:
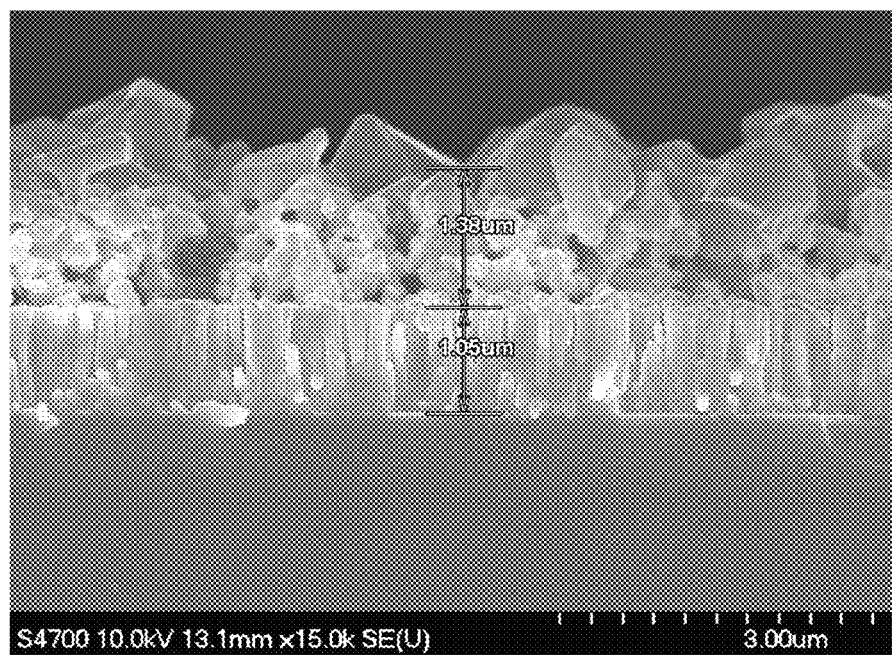

FIG. 6 (a) is an SEM image of a surface of a Cu—Se thin film manufactured in Comparative Example 2, and FIG. 6 (b) is an SEM image of a side section of the Cu—Se thin film manufactured in Comparative Example 2.

Referring to FIG. 6 (a) and FIG. 6 (b), it can be seen that the Cu—Se thin film manufactured in accordance with Comparative Example 2 showed general particle growth, but the thin film had a non-dense structure, and numerous large pores.

Comparative Example 3

A thin film was manufactured in the same manner as in Experimental Example except that selenization heat treatment was performed at a substrate temperature of 550° C. for 30 minutes. Namely, as compared to Experimental Example, the temperature for the selenization heat treatment was the same, but the selenization heat treatment was performed for a relatively short time.

Figure 7:
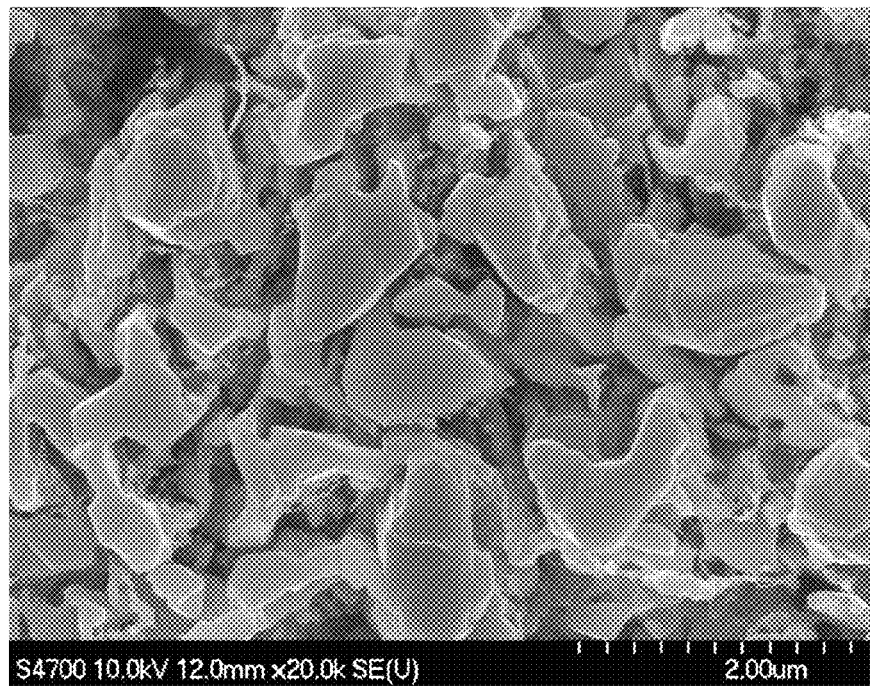
FIG. 7 (a) is an SEM image of a surface of a thin film manufactured in Comparative Example 3, and FIG. 7 (b) is an SEM image of a side section of the thin film manufactured in Comparative Example 3.
Figure 7:
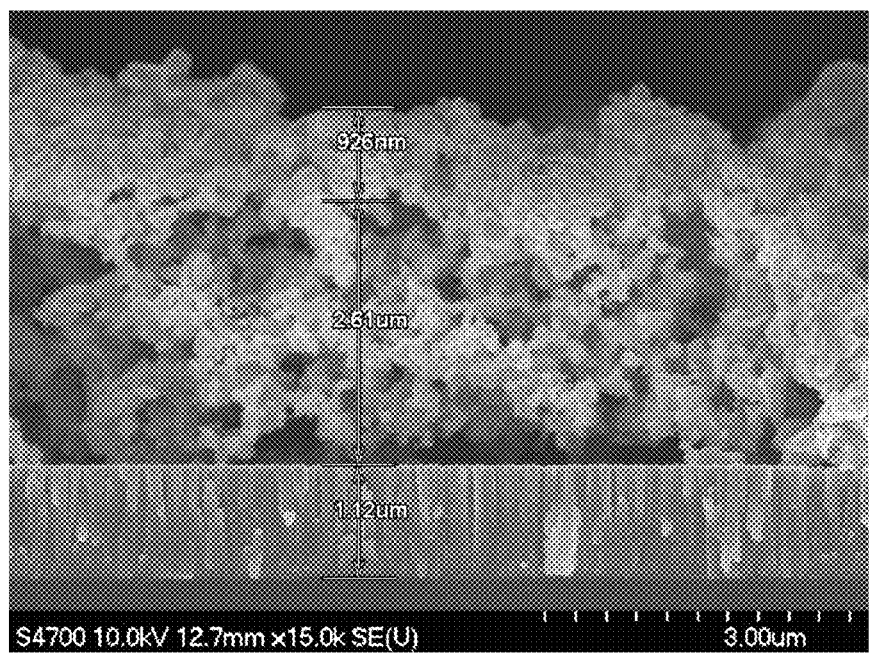
Figure 8:
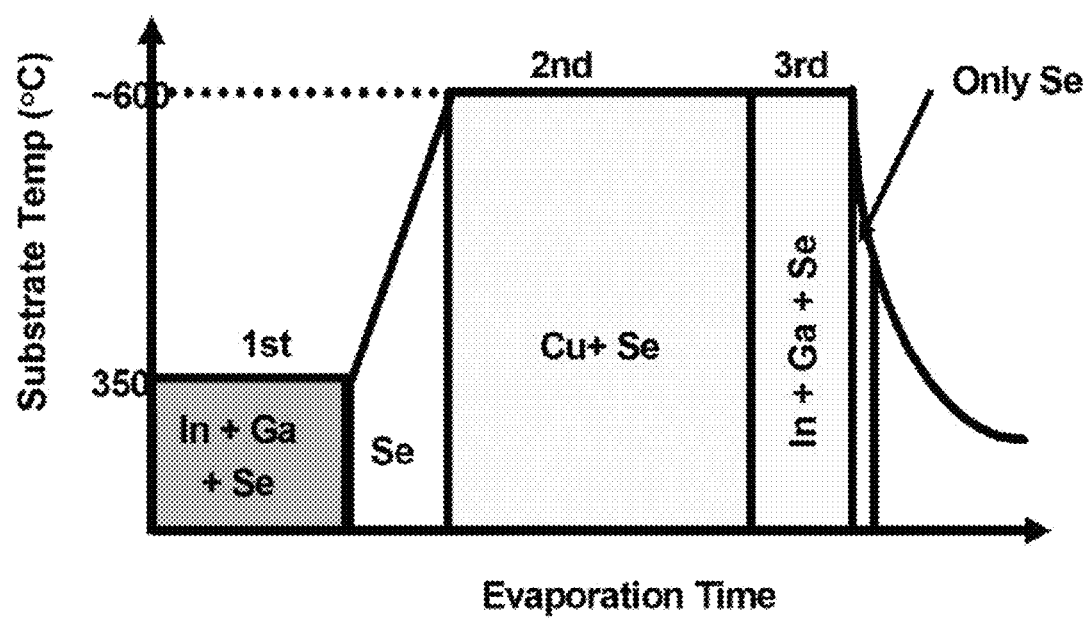
FIG. 8 is a thermal history curve in a typical three-step vacuum co-evaporation process.
Figure 9:
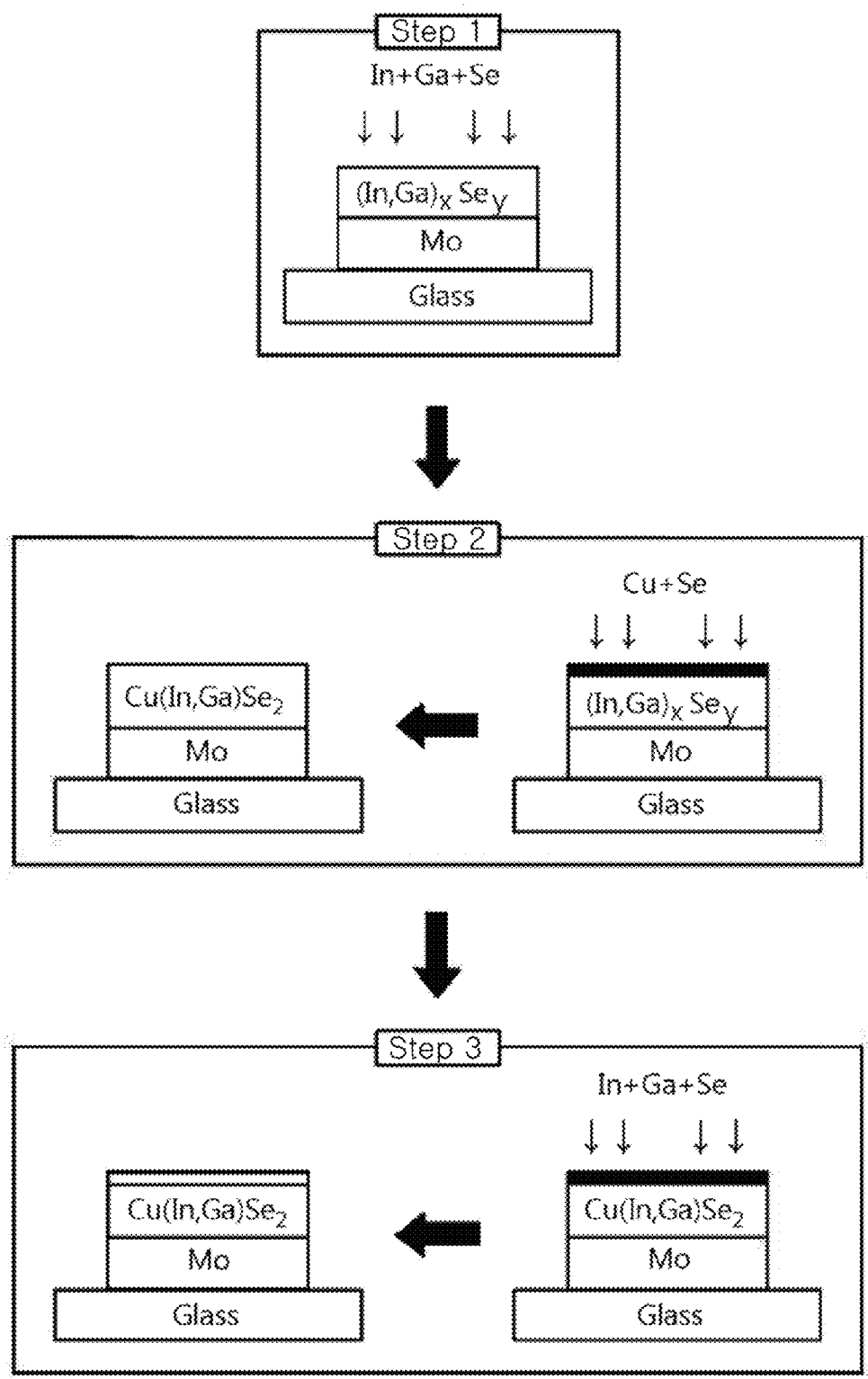
FIG. 9 is a flowchart of the typical three-step vacuum co-evaporation process.

FIG. 7 (a) is an SEM image of a surface of a Cu—Se thin film manufactured in Comparative Example 3, and FIG. 7 (b) is an SEM image of a side section of the Cu—Se thin film manufactured in Comparative Example 3

Referring to FIG. 7 (a) and FIG. 7 (b), it can be seen that particle growth mainly occurred on the surface. The thin film had a non-dense structure and numerous large or small pores.

From examining the surface and inner structure of the Cu—Se thin films manufactured in Comparative Examples 1 to 3, it can be seen that, unlike the Cu—Se thin film of Experimental Example, the Cu—Se thin films of Comparative Examples 1 to 3 showed insufficient particle growth and had a relatively non-dense structure and numerous pores. Thus, it can be seen that it is the critical factor in determining the structure of the thin film to adjust temperature and time conditions within a preferable range in selenization heat treatment, which is the last operation in the method for manufacturing a thin film according to the present invention.

Although some embodiments have been described herein, it will be understood by those skilled in the art that these embodiments are provided for illustration only, and various modifications, changes, alterations and equivalent embodiments can be made without departing from the scope of the present invention. Therefore, the scope and sprit of the present invention should be defined only by the accompanying claims and equivalents thereof.

The invention claimed is:

1. A method for manufacturing a CI(G)S-based thin film using a Cu—Se two component nanoparticle flux, comprising:
    preparing first nanoparticles comprising Cu—Se two-component nanoparticles and preparing second nanoparticles comprising In nanoparticles (Step a);
    preparing a first slurry comprising the Cu—Se two-component nanoparticles by mixing the first nanoparticles, a first solvent, and a first binder, and preparing a second slurry comprising the In nanoparticles by mixing the second nanoparticles, a second solvent, and a second binder (Step b);
    forming a thin film comprised of multiple layers stacked one above another by alternately coating the first slurry comprising the Cu—Se two-component nanoparticles and the second slurry comprising the In nanoparticles onto a substrate (Step c); and
    heat treating the resulting thin film while supplying selenium vapor at a substrate temperature ranging from 520° C. to 550° C. for 60 minutes to 90 minutes (Step d).

2. The method according to claim 1, wherein Step a is performed by any one of a low temperature colloidal process, a solvothermal synthesis process, a microwave process, and an ultrasonic wave synthesis process.

3. The method according to claim 1, wherein the first solvent and the second solvent are both alcohol-based solvents, and where the first solvent and the second solvent are either identical to or different from one another.

4. The method according to claim 3, wherein the alcohol-based solvent comprises any one selected from the group consisting of ethanol, methanol, pentanol, propanol, and butanol.

5. The method according to claim 1, wherein the first binder and the second binder are identical to or different from one another and wherein each binder comprises any one selected from among ethylene glycol, propylene glycol, ethylcellulose, polyvinylpyrrolidone, ethylenediamine, monoethanolamine, diethanolamine, and triethanolamine.

6. The method according to claim 1, wherein Step b further comprises an ultrasonication such that the first slurry components are mixed and dispersed and the second slurry components are mixed and dispersed.

7. The method according to claim 1, wherein Step c is performed by a non-vacuum coating process.

8. The method according to claim 7, wherein the non-vacuum coating process is any one selected from among spraying, ultrasonic spraying, spin coating, doctor blade coating, screen printing, and inkjet printing.

9. The method according to claim 1, wherein Step c further comprises drying after each layer is coated upon formation of the thin film comprised of the multiple layers.

10. The method according to claim 1, wherein the thin film comprised of the multiple layers is a thin film comprised of two or three layers stacked one above another.

11. The method according to claim 1, wherein the second nanoparticles of the second slurry including In nanoparticles further comprise Ga nanoparticles.

* * * * *

UNITED STATES PATENT AND TRADEMARK OFFICE
CERTIFICATE OF CORRECTION

| | | |
|---|---|---|
| PATENT NO. | : 9,496,449 B2 | Page 1 of 1 |
| APPLICATION NO. | : 14/232829 | |
| DATED | : November 15, 2016 | |
| INVENTOR(S) | : Cho et al. | |

It is certified that error appears in the above-identified patent and that said Letters Patent is hereby corrected as shown below:

On the Title Page

Insert:
--[30] Foreign Application Priority Data
Jul. 19, 2011    (KR) ..................... 10-2011-0071294--

Signed and Sealed this
Twenty-second Day of August, 2017

Joseph Matal
*Performing the Functions and Duties of the*
*Under Secretary of Commerce for Intellectual Property and*
*Director of the United States Patent and Trademark Office*